United States Patent [19]
Jaynes et al.

[11] Patent Number: 5,787,092
[45] Date of Patent: Jul. 28, 1998

[54] TEST CHIP CIRCUIT FOR ON-CHIP TIMING CHARACTERIZATION

[75] Inventors: Dwight Jaynes, Richardson; Harold Dozier, Dallas, both of Tex.

[73] Assignee: Hewlett-Packard Co., Palo Alto, Calif.

[21] Appl. No.: 863,833

[22] Filed: May 27, 1997

[51] Int. Cl.⁶ .................................................. G06F 11/00
[52] U.S. Cl. ........................................................ 371/22.1
[58] Field of Search ............................ 371/22.1, 22.2, 371/22.36, 22.5, 24, 25.1, 27.4, 27.7; 395/500

[56] References Cited

U.S. PATENT DOCUMENTS 5,475,830  12/1995  Chen et al. ................. 395/500
5,649,167   7/1997  Chen et al. ................. 395/500

*Primary Examiner*—Vincent P. Canney

[57] ABSTRACT

The inventive system and method determines path delay of at least one test path of logic gates. The invention uses a toggle register to generate a toggling signal, that is sent out onto the path by a launch register. A capture register receives the signal from the other end of the path. A logic gate compares the received signal from a prior launched signal with an inverted launched signal. Since the signal is a toggling signal the prior received signal should be the same as an inverted launched signal. A latch register determines whether the logic gate has detected a match between inverted launched signal and the received signal from a prior launch signal within a predetermined time clock period. As the clock period is shortened, the launched signal will fail to traverse the path and be captured by the capture register within the clock period. This will cause a mis-match in the logic gate. The clock period at the point of mis-match is the delay time of the path. The invention can use two paths to produce a very accurate comparison of the delays on the two paths.

50 Claims, 3 Drawing Sheets

5,787,092

TEST CHIP CIRCUIT FOR ON-CHIP TIMING CHARACTERIZATION

TECHNICAL FIELD OF THE INVENTION

This application relates in general to integrated circuit characterization testing, and in specific to obtaining performance data to validate the design models.

BACKGROUND OF THE INVENTION

Vendors or chip manufacturers supply the information that is used for the timing verification in simulation models of chip designs. However, the different vendors have a wide variety in the quality and the quantity of actual margins that they have built into the models that they provide. Vendors can be conservative in nature and only use models that are based largely from current production. On the other hand, vendors can be more aggressive, and use models that are based off of projections of what they expect their production process to be at the time when the proposed design will be achieving a production volume. Thus, the vendors may provide models that have a great deal of variation as compared with the actual design.

In the case of the conservative vendor, there will be ample margin. In fact, the margin may be so great that there is an overly conservative design resulting in lack luster performance, because full advantage was not taken of the capabilities of the current technology. This of course leads to a poor showing in the marketplace as compared to competitors. But conversely, in the case of the aggressive vendor, little margin will exist. If too little margin exists, there is the risk of being unable to achieve the simulated or predicted performance in the production device.

Because of this difference in attitude and approach of the different vendors in supplying the design models, it is very valuable to be able to check the actual performance with a test case, and thus determine which attitude and approach the vendor uses.

Consequently, a system designer faces a dilemma in regards to the models that are used in the actual design simulation, that is often solved by creation of their own models. The designers will often attempt to derive their own models, and either build in extra conservatism or margins if they believe that the vendor is not conservative enough, or they will actually be more aggressive than what the vendor states is possible in order to mitigate some of the vendor margin overage, and thus realize a better design for the marketplace.

This is often attempted, but at great peril, because unless the designer makes an accurate assessment of the vendor's margins, the system will either not function or be underpowered. Most designers are hesitant to do this type of assessment because it means relying upon and creating models that are not supplied directly by the vendor.

This type of assessment has traditionally been done with test cases or test chips, which would have signal paths through the device where a simulation was performed and measurements were taken. The designer would attempt to correlate between the simulation and measurements to validate that modeled performance matches measured performance. This typically is inadequate however, because very often the testing is performed on a very small sample and it is consequently difficult to collect statistically valid data. Moreover, the testing is also inaccurate because the typical measurements will include large amounts of input/output (I/O) delay and/or clock distribution delay, both of which will contribute to a general error in measurement of the actual on-chip delay. The actual on-chip gate delays are typically in the ranges of 100 to 200 pico seconds or less, and they will be obscured by the errors and the uncertainty that is introduced into the measurement from the I/O, clock distribution delay, and the measurement technique that is applied.

SUMMARY OF THE INVENTION

These and other objects, features and technical advantages are achieved by a system and method which in a designer can use models that are supplied by a vendor in a simulation to validate the timing of the high-performance integrated circuit. The invention allows a designer to actually measure a test circuit with the necessary accuracy to be able to ascertain exactly how conservative the vendor's design rules are and accordingly adjust the design margins.

The invention uses a tightly-controlled test circuit that has minimum measurement error due to differences that might exist in an on-chip layout or from clock skew, and eliminates the possibility of having skew or error introduced by I/O. This circuit enables the designer to make a comparative measurement between two different paths. These paths are so constructed that the any error introduced is minimal, because the same layout is used with only very minor differences on-chip between two paths. This allows an accurate comparative reading on those two paths performance, so that from a measurement standpoint, the designer is able to produce a delta or differential between the performance of the two paths. This allows the designer to compare the differential of these two cases with an extremely low error rate. The invention allows the designer to make numerous comparisons for cases of particular concern, for example cases of heavy or lighter loads can be mapped out and compared very directly with little error.

The invention uses a transition signal that is a rising or a falling transition, which is launched down the path that is to be measured and then captured in a register at the other end of the path. A varying clock is used to precisely determine the path timing. The designer then can throw a MUX selection switch to change the measured path from the A path to the B path and measure the other path using exactly the same register to launch and exactly the same register to receive, with the exact same minor clock skew circumstances.

The returning signal that is latched into the receiving register can be read either through scan or via an external pin. Thus, the entire measurement is contained on the die and does not require I/O for the path that is actually being measured. The timing is controlled by the clock only and the sending and receiving registers are physically placed very close together on the die, and also on the same final leaf of the clock tree, so that there is very little skew in the clocking of the two registers. This results in a very small amount of error from clock skew and makes the dominant part of the timing measurement the from path itself.

Thus, the invention allows the designer to make very precise measurements of two or more paths, and then a precise comparison of the paths. Each of the measured paths can be compared with the simulated paths, meaning that path A's measured versus simulated and path B's measured versus simulated can be compared. Also, the delta between path A and B as measured can be compared with the delta between path A and B as simulated to give better characterization feedback.

Each path comprises macros of particular types from the vendor that are chained together. In fact, it is possible, to take every macro that is in the entire library and make a meaningful measurement of the timing delay through multiple copies of that macro type and ascertain feedback on every element in the library. However, it is not really necessary to perform this test on every macro, because in typical designs, macro libraries are replications of the same core design elements. These elements or driver types are used as a base level to construct the more complex macros in the library.

Therefore, it is really much more interesting and efficient to test the core design elements or driver types which are representative of the macros in the library. These elements can have their drive characteristics examined under various conditions, typically the load conditions under which they drive. For example, drivers can have very light loads or very heavy loads in terms of the amount of capacitance that they have to drive. The nature of the load can be very gate intensive, so a heavier load is due to more capacitance load from the gate capacitance of a fan out to multiple input on multiple devices. Load can also be dominated by wire delay or the delay that is inherent in the interconnect.

By varying and parameterizing the devices or elements in the path, the designer can ascertain feedback on the performance by testing a variety of drive strengths, driving into a variety of load conditions to get a base level characterization of the fundamental driver, and driving into very realistic load conditions. Both the driver's performance and the load conditions are a function of the process and are the parameters which control the performance of the timing of the overall super set of macros that are the entire library.

A macro is a cell or a gate that is built out of individual transistors. For instance, a NOR gate is a macro. Moreover, a flip flop is also a macro which might be formed from two cross coupled NOR gates, with the NOR gates as its core elements. A macro can also be anything that can cause delay. So the more complex macros, such as a four bit adder, are constructed from core elements that are simple block logic arrangements, such as NOR gates. Thus, if the core element or driver is characterized, the more complex macros can also be characterized. Therefore, data comparing measured versus simulated performance can be determined that reflects the base level performance for the entire library.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
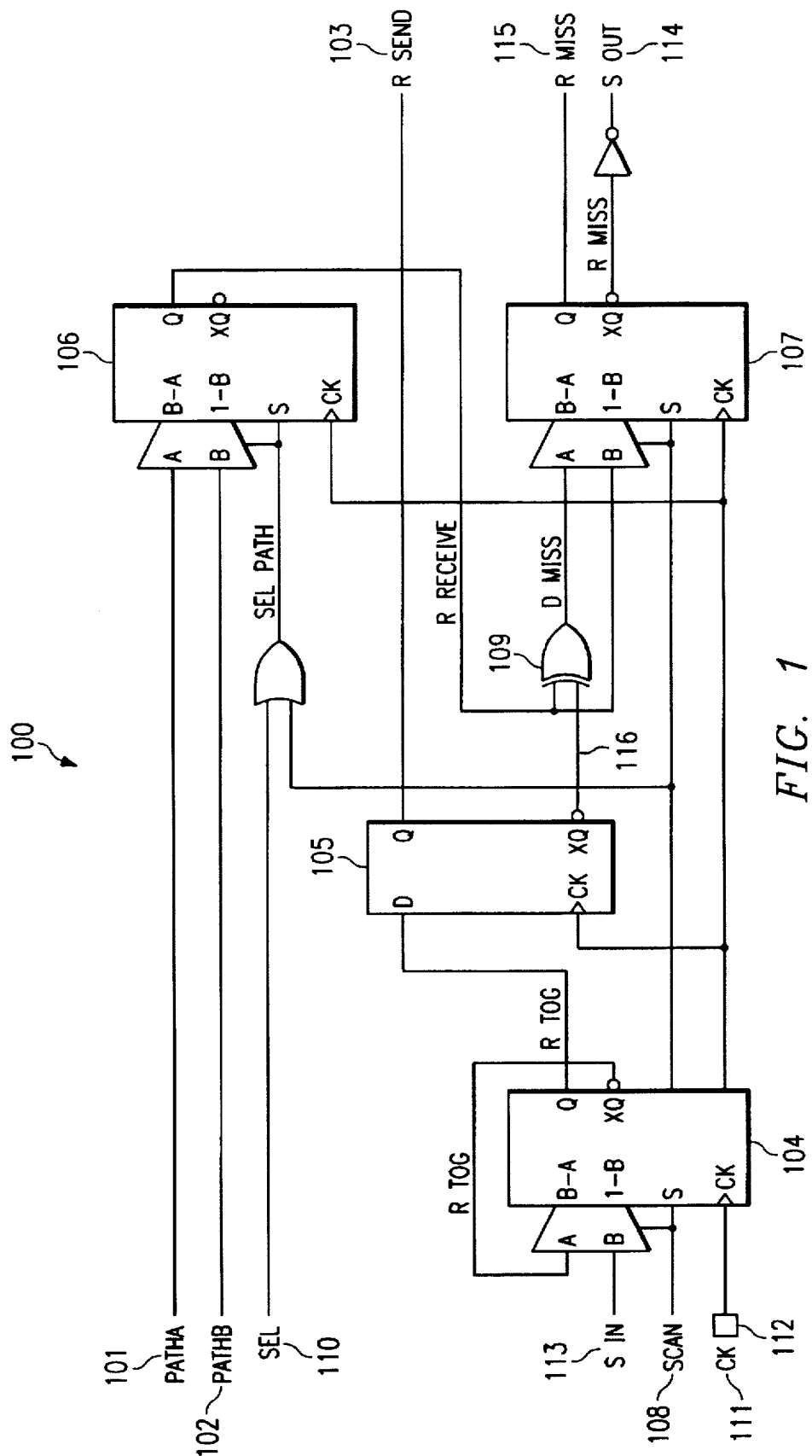
FIG. 1 depicts a schematic diagram of the inventive register circuit.

FIG. 1 depicts the inventive register circuit 100. This circuit 100 wraps back on itself by sending a signal out on line R_SEND 103 and returning through PATHA 101 and PATHB 102. Toggle generation register 104 is set up in a feedback arrangement having its inverting output XQ fed back into the input MUX. This produces a self-sustaining, toggling register, which will toggle on each clock cycle. Toggle register 104 is connected with scan line 108 for testability purposes.

The toggling Q output from toggling register 104 then feeds directly into the D input of launch register 105. This register, through its Q output, launches a rising and then a falling toggling output into the path under test via R_SEND line 103. This line connects to the arrangements shown in FIGS. 2 and 3, where it then fans out to two separate paths which are the two paths that are measurable by this circuit.

The paths then return into circuit 100 as PATHA 101 and PATHB 102. PATHA 101 and PATHB 102 go into the A and B of the input MUX of the capture or receiving register 106. Capture register 106 then has its Q output sent into an XOR logic gate 109 where it is logically XOR compared to expect signal 116 from the XQ output of launch register 105, that subsequently feeds into latching register 107, which is then observable typically on an output pin via the error signal R_MISS 115. Latching register 107 is also scan observable, if necessary, to retrieve the latching result of a failure or a pass out of the register.

The basic operation of circuit 100 is such that it is continuously sending transitions out of launch register 105, which are then received in capture register 106 having been transferred to it by either the PATHA or PATHB, whichever path is currently being measured, which is selected by the MUX via SEL line 110.

Figure 2:
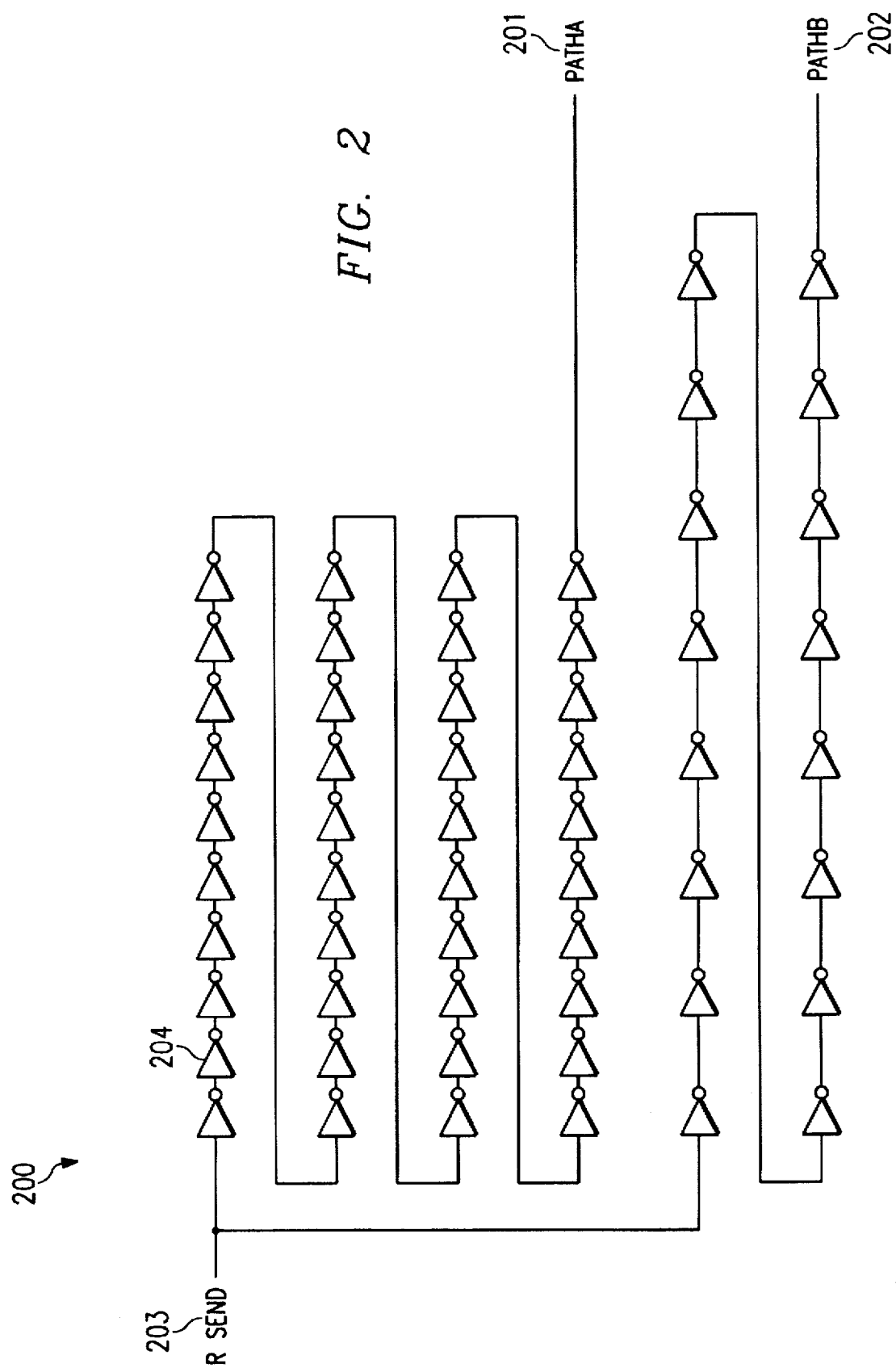
FIG. 2 depicts two serial paths of inverters, which are connected to the respective signal lines of the circuit of FIG. 1.
Figure 3:
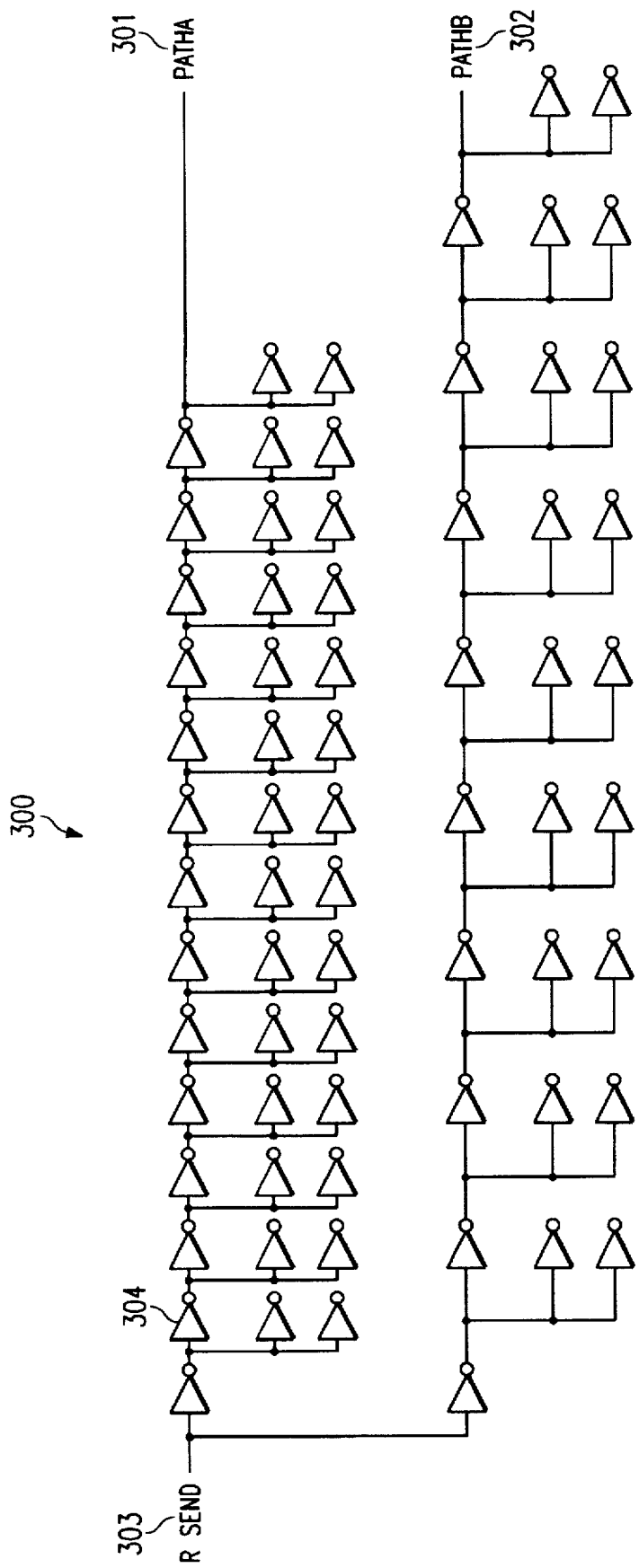
FIG. 3 depicts two paths having fan out of inverters, which are connected to the respective signal lines of the circuit of FIG. 1.

Testing of a test path, like those shown in FIGS. 2 and 3, begins with a long clock cycle and a very low frequency, so that there is plenty of time for the transition edge signal sent from the launch register 105 to propagate through the path under test and be caught with great margin in the capture register 106. As the frequency of clock signal CK 111 is increased, and the cycle time is reduced, it becomes increasingly difficult to capture the transition edge, and it will eventually result in failure. The failure point indicates the timing for the path. The clock frequency at the point of failure is directly converted to a period which is the measured delay for the path selected.

The clock frequency to the chip itself is varied by external instrumentation 112. Typically, a function generator is used to drive clock signal CK 111 through a typical clock distribution system to provide a low skew clock and a very precise frequency input in measurement scheme so that the input frequency to the clock system can be monitored. A sample of the clock will be taken off at the bottom leaf of the clock tree and observed at an output pin to provide a secondary way to sense the internal clock rate and ascertain how much clock skew is present.

Because a toggle is being performed, there is a very predictable behavior in circuit 100. Thus, the returned toggle signal can be monitored by virtue of XOR gate 109 into latching register 107, which determines, cycle by cycle, whether or not the correct data has been captured. The clock cycle is cranked up to achieve a higher and higher frequency, until the point where the latch perceives that a failure has occurred, because capture register 106 has failed to meet its setup time on the changing data and as a result has the wrong value stored therein. This value is detected by the XOR gate 109 as a failure. XOR gate 109 is providing a comparison between the prior states, since it is fed off of the Q bar or XQ output of launch register 105. That state is then compared with the current state from the Q output of capture register 106. XOR gate 109 sends an error result if a correct match is not received, that is latched in latching register 107 where it is visible on an output.

A continuous measurement is being performed on each clock cycle. Any error in the measurement is only dependent in very minor local variations in the physical layout of the registers. It is driven completely off of the clock itself and these registers are typically laid out and placed very close together so they have minimal clock skew. Moreover, the clock itself is designed in a clock tree to minimize skew, this is one of the fundamentals of a high performance design. It already is the highest performance circuit element that can be used for doing a timing measurement.

Furthermore, all of registers are held in close physical proximity, but launch register 105 and capture register 106 must be as close as possible to each other. These two registers are clocked off of the very lowest branch of the clock tree, the bottom leaf cell of the clock, thus they have very minimal skew.

The path then can go off and cover a large area of the die and returns, so that these two registers are physically close. The path itself is not restricted to be short or to be in a very localized zone. In fact, the path very often will be spread across a large area of the die to get more of the variation that can occur as a large die is crossed, for example from center to corner or from corner to corner, and thus observe IR drop and other on chip layout phenomenon that vary across the die. Those characteristics can also be measured with this type of circuit, because abnormally long path delays are not predicted by simulation.

After completing the measurements on the first path, PATHA 101, a measurement can be made on PATHB 102. SEL signal 110 will change the MUX on capture register 106 to read PATHB 102. After PATHB 102 is read, the two paths can be compared with each other. The precision of the comparison is greater because not only is there already a precise way of determining delay with minimum error, but also the relative measurement between the two paths is precise because the exact same registers are used for launching and capturing.

Any error in the comparison not attributed to the paths is due just to the MUX of capture register 106. Thus, any error that would have been caused by the replication of circuit 100 has been eliminated. It is possible to add additional logic to circuit 100 to accommodate compressions of three or more paths, but the variation in the MUX path delay will add additional error to the measurements. Moreover, circuit 100 could be replicated on a die, with each path connected thereto devised to measure different characteristics or different macros or core elements. Circuit 100 could also be replicated on a die with each PATHA being identical and each PATHB being identical, to measure differences in die location.

All of this logic on circuit 100 has to be testable and under certain circumstances the designer may want to scan out the results as captured in capture register 107. To make that possible, the scan in pin S_IN 113 is connected to the B input of the MUX on toggle register 104. When scanning, SCAN signal 108 is asserted, then S_IN 113 will feed into toggle register 104 through the B MUX input. The Q output of toggle register 104 flows directly into launch register 105, the Q output of which flows into the paths via R_SEND 103. SCAN 108 signal changes the selected path of capture register 106, so that PATHB 102 is the path that is selected under the scan situation.

The signal returns back to circuit 100 as Path PATHB on the B side of the MUX on capture register 106. The signal is output on the Q output of capture register 106, and is fed into the B side of the MUX on the latching register 107, thus by-passing the XOR gate 109. The Q output off of latching register 107 is error signal R_MISS 115. The Q bar output or XQ is inverted to negate its inversion, to keep an inversion out of the scan chain, and is passed in the scan chain as the scan out signal S_OUT 114. The scan register order then is register 104 going to 105, going to 106, going to 107. This is how the scan chain is hooked up and enables the logic testing.

FIG. 2 depicts an arrangement of test circuit 200 having two serial paths of inverters 204. The two paths share the same input path, R_SEND 203. This signal line is what originates from launch register 105 of FIG. 1. The signal is fanning into two serial streams of inverters 204. PATHA 201 has a total of 40 inverters, that are then connected to the A side of the MUX on capture register 106. PATHB has a total of 16 inverters 204, that are then connected to the B side of the MUX on capture register 106.

However, the different paths have nearly the same amount of delay time, as predicted from the vendor's information. In PATHA 201, the wire delay is minimal, as the inverter macros have been physically placed as close as they possibly can be to each other, so that they are essentially driving nearly no wire connection, and going straight into the next macro stage. This arrangement represents intrinsic delay, or the delay of the silicon in the macros with very little load factor. In PATHB 202, however, there are fewer inverter macros involved, but they are each driving a heavier load. There is more wire, and therefore more of the wire related delays. The LRC associated with the inductance, resistance, and capacitance of the wire is now contributing to the delay time, but with only 16 inverters, the additional delay from the wire, roughly equates to the intrinsic delay of the inverters of PATHA 201.

Note however, that it is not essential that the paths have the exact same delay. So long as they are on the same order of magnitude, then there is a very similar measurement and there is less opportunity for error that would be attributed to variation in the clock frequency source, as the clock source is swept. In other words, a failure will be detected by XOR gate 109 at approximately the same clock frequency, so that a comparison of the two paths will yield more accurate results. For this reason, the number of macros and the wire length is chosen to achieve nearly the same path delays, although not necessarily precisely the same.

FIG. 3 depicts a second arrangement of a test circuit 300 having two serial paths of inverters 304. Here, the number of inverters in the serial chain is lower than that of FIG. 2, but on both paths, the fan out has increased. This arrangement 300 represents a different kind of load condition than that of the arrangement 200.

In FIG. 3, two variations that can exist on load are being examined, where PATHA 301 case has a fan out load, which is largely a capacitance load due to gate fan out, and a minimum amount of wire (as in PATHA 201), with 14 inverter macros 304 serially arranged, with each fanning out to two more. PATHB 302 has a more realistic or balanced combination of fan out and wire delay, in that there is more wire (as in PATHB 202) but with only 10 serially disposed inverter macros 304, each with the same fan out as in PATHA 301. Again the wire length and number of inverters is chosen so that the delays are approximately the same as for the two paths described in regards to FIG. 2. By this method, the two paths can be precisely compared. Other arrangements can readily be made, for example, PATHA 201 from arrangement 200 can be compared to PATHA from arrangement 300. Other macros can be used in place of the inverters, such as NOR gates.

The types of elements that are included in the path are selected on the basis of a review of the library that will be used on the actual design. An analysis is undertaken of the elements within the macro library, which can typically have 60 or 70 elements in the macro library. The transistor schematics of the actual macro designs are broken down by driver types to examine the characteristic driver types and relative circuit element types that will relate to the timing performance of the macros.

Typically underlying the large macro library are a subset of basic driver types and basic circuit combinations which are used and reused to create the multiple macros that are in the library. The fundamentals of the different types are reduced down into core element macros, which are typically going to be represented by inverters with various drive strengths, and/or simple gates such as two input XORs, two input NORs and two input NANDs. These elements are then used to construct the chains depicted in FIG. 2 and 3, and are used in combination with the extremes on load types so that the fan out is being pushed to get an extreme gate capacitance variation, and the wire delay or the lack of wire delay to get the intrinsic case. These elements are then selected and targeted for path delay measurements.

The analysis of the individual library in breaking it down into fundamentals is an important step and can vary from design to design as to which elements would be chosen. Once the measurements are taken from a physical test chip (or several test chips) of the chosen elements, then they are compared with the simulated results from the information provided by the vendor. This will identify whether the vendor is conservative or aggressive, and allow more accurate setting of the margins in the design of the actual products by adding additional conservatism or margins into the design where the vendor information has been proven to be too aggressive, or removing some margins and push a more aggressive timing model and transfer the extra performance to the customer in the end via the design.

Other anomalies may arise from the measurement to simulation comparison of different arrangements on the same die. For instance, comparison of measured delay to simulation on a lightly loaded intrinsic delay dominated path might indicate that the die as processed is faster than simulation predicts by a large amount. On the same test die, measured verses simulated comparison of a heavily gate or fan out loaded path might indicate that the die is slower than simulation predicts. Anomalies that are produced by doing these corner point measurements will often key the designer to particular problems with the modeling schemes of the vendors that may result in changing the strategy for accounting for delays or fine tuning the assumptions for setting the margins as to more or less conservative in the actual finish design.

Although the present invention and its advantages have been described in detail, it should be understood that various changes, substitutions and alterations can be made herein without departing from the spirit and scope of the invention as defined by the appended claims.

What is claimed is:

1. A system for determining path delay of at least one test path, the path including a plurality of macros, the system comprising:

means for generating a toggling signal;

means for launching the signal onto one end of the path;

means for capturing the signal from the other end of the path; and means for determining an amount of path delay by comparing a function of the launched signal with a function of the captured signal.

2. The system of claim 1, wherein the means for determining further comprises:

means for comparing the function of the launched signal with the function of the captured signal; and means for determining whether the means for comparing has produced a proper result within a predetermined time period;

wherein if the result is improper then the time period is a function of the path delay.

3. The system of claim 2, further comprising:

means for changing the predetermined time period;

wherein the time period is decreased until the improper result is determined.

4. The system of claim 3, wherein:

the function of the launched signal is an inverse function; and the function of the captured signal is a direct relationship to the captured signal.

5. The system of claim 3, wherein:

the captured signal is from a prior toggle signal.

6. The system of claim 1, wherein the system determines path delay for a first test path and a second test path, the system further comprises:

means for selecting between the first path and the second path.

7. The system of claim 6, wherein:

the first test path that includes a plurality of first macros arranged to test a first characteristic; and the second test path that includes a plurality of second macros arranged to test a second characteristic.

8. The system of claim 7, wherein:

the first characteristic and the second characteristic are different; and the first macros and the second macros are of a similar type.

9. The system of claim 8, wherein:

the first macros and the second macros are inverters.

10. The system of claim 8, wherein:

the first macros and the second macros are NOR gates.

11. The system of claim 8, wherein:

the first macros and the second macros are logic gates.

12. The system of claim 8, wherein:

the first macros and the second macros are formed from arrangements of logic gates.

13. The system of claim 8, wherein:

the first path has approximately zero wire delay, more macros than the second path, and a portion of the macros are fanned out from the remaining macros; and the second path has significant wire delay, fewer macros than the first path, and a portion of the macros are fanned out from the remaining macros.

14. The system of claim 8, wherein:

the first path has approximately zero wire delay and more macros than the second path; and the second path has significant wire delay and fewer macros than the first path.

15. The system of claim 7, wherein:

the first characteristic is intrinsic delay.

16. The system of claim 7, wherein:

the second characteristic is wire delay.

17. The system of claim 7, wherein:

the number of macros and the amount of wire delay is selected according to simulation data so that the first and second paths have approximately equal path delays.

18. A system for determining path delay of at least one test path, the path including a plurality of macros, the system comprising:

a toggle register for generating a toggling signal;

a launch register for sending the toggling signal onto one end of the path;

a capture register for receiving the signal from the other end of the path;

a logic gate for comparing a function of the received signal with a function of sent signal; and a latch register for determining whether the logic gate has produced a proper result within a predetermined time period;

wherein if the result is improper then the time period is a function of the path delay.

19. The system of claim 18, further comprising:

means for changing the predetermined time period;

wherein the time period is decreased until the improper result is determined.

20. The system of claim 19, wherein:

the function of the launched signal is an inverse function; and the function of the captured signal is a direct relationship to the captured signal.

21. The system of claim 20, wherein:

the captured signal is from a prior toggle signal.

22. The system of claim 18, wherein the system determines path delay for a first test path and a second test path, the system further comprises:

a multiplexer for selecting between the first path and the second path.

23. The system of claim 22, wherein:

the first test path that includes a plurality of first macros arranged to test a first characteristic; and the second test path that includes a plurality of second macros arranged to test a second characteristic.

24. The system of claim 23, wherein:

the first characteristic and the second characteristic are different; and the first macros and the second macros are of a similar type.

25. The system of claim 24, wherein:

the first macros and the second macros are inverters.

26. The system of claim 24, wherein:

the first macros and the second macros are NOR gates.

27. The system of claim 24, wherein:

the first macros and the second macros are logic gates.

28. The system of claim 24, wherein:

the first macros and the second macros are formed from arrangements of logic gates.

29. The system of claim 24, wherein:

the first path has approximately zero wire delay, more macros than the second path, and a portion of the macros are fanned out from the remaining macros; and the second path has significant wire delay, fewer macros than the first path, and a portion of the macros are fanned out from the remaining macros.

30. The system of claim 24, wherein:

the first path has approximately zero wire delay and more macros than the second path; and the second path has significant wire delay and fewer macros than the first path.

31. The system of claim 23, wherein:

the first characteristic is intrinsic delay.

32. The system of claim 23, wherein:

the second characteristic is wire delay.

33. The system of claim 23, wherein:

the number of macros and the amount of wire delay is selected according to simulation data so that the first and second paths have approximately equal path delays.

34. A method for determining path delay of at least one test path, the path including a plurality of macros, the method comprising the steps of:

generating a toggling signal;

launching the signal onto one end of the path;

capturing the signal from the other end of the path; and determining an amount of path delay by comparing a function of the launched signal with a function of the captured signal.

35. The method of claim 34, wherein the step of determining further comprises the steps of:

comparing the function of the launched signal with the function of the captured signal; and determining whether the comparison has produced a proper result within a predetermined time period;

wherein if the result is improper then the time period is a function of the path delay.

36. The method of claim 35, further comprising the step of:

decreasing the predetermined time period until the improper result is determined.

37. The method of claim 36, wherein:

the function of the launched signal is an inverse function; and the function of the captured signal is a direct relationship to the captured signal.

38. The system of claim 36, wherein:

the captured signal is from a prior toggle signal.

39. The method of claim 34, wherein the method determines path delay for a first test path and a second test path, the method further comprises the step of:

selecting between the first path and the second path.

40. The method of claim 39, further comprising the steps of:

arranging a plurality of first macros on the first test path to test a first characteristic; and arranging a plurality of second macros of the second test path to test a second characteristic.

41. The method of claim 40, wherein:

the first characteristic and the second characteristic are different; and the first macros and the second macros are of a similar type.

42. The method of claim 41, wherein:

the first macros and the second macros are inverters.

43. The method of claim 41, wherein:

the first macros and the second macros are NOR gates.

44. The method of claim 41, wherein:

the first macros and the second macros are logic gates.

45. The method of claim 41, further comprising the step of:

forming the first macros and the second macros from arrangements of logic gates.

46. The method of claim 41, further comprising the steps of:

forming the first path with approximately zero wire delay and more macros than the second path, and fanning out a portion of the macros from the remaining macros; and forming the second path with significant wire delay and fewer macros than the first path, and fanning out a portion of the macros from the remaining macros.

47. The method of claim 41, further comprising the steps of:

forming the first path with approximately zero wire delay and more macros than the second path; and forming the second path with significant wire delay and fewer macros than the first path.

48. The method of claim 40, wherein:

the first characteristic is intrinsic delay.

49. The method of claim 40, wherein:

the second characteristic is wire delay.

50. The method of claim 48, further comprising the step of:

selecting the number of macros and the amount of wire delay according to simulation data so that the first and second paths have approximately equal path delays.

* * * * *